(12) United States Patent
Ishibashi et al.

(10) Patent No.: US 10,659,888 B2
(45) Date of Patent: May 19, 2020

(54) SENSOR OUTPUT DEVICE, SOUND OUTPUT DEVICE, AND MUSICAL INSTRUMENT

(71) Applicant: YAMAHA CORPORATION, Hamamatsu-shi (JP)

(72) Inventors: Susumu Ishibashi, Hamamatsu (JP); Masao Noro, Hamamatsu (JP); Yohei Ohtani, Iwata (JP); Tomonobu Sugimoto, Hamamatsu (JP)

(73) Assignee: YAMAHA CORPORATION, Hamamatsu-Shi (JP)

(*) Notice: Subject to any disclaimer, the term of this patent is extended or adjusted under 35 U.S.C. 154(b) by 0 days.

(21) Appl. No.: 16/182,028

(22) Filed: Nov. 6, 2018

(65) Prior Publication Data

US 2019/0141455 A1 May 9, 2019

(30) Foreign Application Priority Data

Nov. 7, 2017 (JP) ................. 2017-214942

(51) Int. Cl.
*H04R 17/00* (2006.01)
*H01L 41/04* (2006.01)
*H01L 41/193* (2006.01)
*G10H 3/14* (2006.01)
*H01L 41/113* (2006.01)
*G01H 11/08* (2006.01)
(Continued)

(52) U.S. Cl.
CPC ............. *H04R 17/00* (2013.01); *G01H 11/08* (2013.01); *G10H 3/146* (2013.01); *H01L 41/042* (2013.01); *H01L 41/1132* (2013.01); *H01L 41/193* (2013.01); *G10H 3/181* (2013.01); *G10H 2220/531* (2013.01); *G10H 2220/555* (2013.01); *G10H 2230/255* (2013.01); *H01L 41/047* (2013.01); *H04R 3/00* (2013.01); *H04R 19/013* (2013.01); *H04R 19/016* (2013.01)

(58) Field of Classification Search
CPC ......... H04R 17/00; H04R 3/00; H01L 41/042; H01L 41/1132; H01L 41/193; H01L 41/047
See application file for complete search history.

(56) References Cited

U.S. PATENT DOCUMENTS 9,923,363 B2 * 3/2018 Ishii ....................... H04R 3/007
2006/0053904 A1 3/2006 Sugiura
(Continued)

FOREIGN PATENT DOCUMENTS

JP S5584684 U 6/1980
JP S63096485 U 6/1988
(Continued)

OTHER PUBLICATIONS

Extended European Search Report issued in European Appln. No. 18204313.3 dated Apr. 4, 2019.
(Continued)

*Primary Examiner* — Disler Paul
(74) *Attorney, Agent, or Firm* — Rossi, Kimms & McDowell LLP (57) ABSTRACT

A sensor output device includes a sensor and an output circuit. The sensor includes a piezoelectric element and an output terminal. The piezoelectric element includes porous resin. The output circuit is connected to the output terminal of the sensor and includes a thermistor.

14 Claims, 6 Drawing Sheets

(51) Int. Cl.
    *H04R 3/00*      (2006.01)
    *G10H 3/18*      (2006.01)
    *H04R 19/01*     (2006.01)
    *H01L 41/047*    (2006.01)

(56) References Cited

U.S. PATENT DOCUMENTS

| | | | |
|---|---|---|---|
| 2008/0202664 A1* | 8/2008 | Pletner | H01L 41/053 156/60 |
| 2014/0153731 A1* | 6/2014 | Pan | G10K 11/002 381/71.1 |
| 2014/0348339 A1* | 11/2014 | Tseng | H04R 1/1041 381/74 |
| 2016/0027422 A1* | 1/2016 | Baker | G10H 3/22 84/726 |
| 2016/0116193 A1* | 4/2016 | Uratani | B05B 5/16 239/690 |
| 2016/0127836 A1* | 5/2016 | Zaitsu | H04R 7/045 455/550.1 |
| 2017/0127205 A1* | 5/2017 | Lin | H04R 29/001 |
| 2018/0209838 A1 | 7/2018 | Miyata et al. | |
| 2018/0252594 A1* | 9/2018 | Jenkner | G01L 11/02 |
| 2018/0366636 A1 | 12/2018 | Miyake | |
| 2019/0082250 A1* | 3/2019 | Cruz-Hernandez | G08B 6/00 |

FOREIGN PATENT DOCUMENTS

| | | |
|---|---|---|
| JP | H01136429 U | 9/1989 |
| JP | H0829181 A | 2/1996 |
| JP | 2006064594 A | 3/2006 |
| JP | 2006119035 A | 5/2006 |
| JP | 2009139730 A | 6/2009 |
| JP | 2010089495 A | 4/2010 |
| JP | 2017158419 A | 9/2017 |
| WO | 2011111125 A1 | 9/2011 |
| WO | 2017056819 A1 | 4/2017 |

OTHER PUBLICATIONS

Office Action issued in Chinese Appln. No. 201811300893.6 dated Oct. 9, 2019. English translation provided.

Office Action issued in Japanese Appln. No. 2017-214942 dated Sep. 24, 2019. English machine translation provided.

* cited by examiner

SENSOR OUTPUT DEVICE, SOUND OUTPUT DEVICE, AND MUSICAL INSTRUMENT

CROSS-REFERENCE TO RELATED APPLICATION

Priority is claimed on Japanese Patent Application No. 2017-214942, filed Nov. 7, 2017, the content of which is incorporated herein by reference.

BACKGROUND OF THE INVENTION

Field of the Invention

The present invention relates to a sensor output device that includes a piezoelectric element containing porous resin, a sound output device, and a musical instrument that includes the sound output device.

Description of Related Art

A vibration detection sensor has been known that is attached on a vibrating part of an object in which vibration detection is performed and that is capable of detecting vibration of the vibrating part and outputting the vibration as an electrical signal. As such a vibration detection sensor, a sensor has been known in which a piezoelectric element is used. The piezoelectric element includes a porous resin film with electrode layers disposed on both faces of the porous resin film (for example, see Japanese Unexamined Patent Application, First Publication No. 2010-89495).

A sensor that includes such a sheet-like piezoelectric element containing porous resin is suited to detection of sound owing to the softness of the sensor in the thickness direction, and does not inhibit vibration of the object in which vibration detection is performed owing to lightweight properties and thinness of the sensor. Therefore, a sensor that includes such a piezoelectric element containing porous resin is suitably used as a pickup for a musical instrument that detects both vibration and sound.

SUMMARY OF THE INVENTION

However, in a sensor that includes a piezoelectric element containing porous resin, the temperature dependence of the sensitivity is high, with the output level of the sensor greatly varying depending on the ambient temperature. Therefore, when used as a pickup for a musical instrument, for example, the temperature of the sensor rises due to illumination on the stage or the like, leading to a large fluctuation in the output level of the sensor.

The present invention has been made in view of the above circumstances, and an object of the present invention is to provide a sensor output device that includes a sensor including a piezoelectric element that contains porous resin and that is capable of temperature compensation for suppressing fluctuation in the output level due to temperature change, a sound output device, and a musical instrument that includes the sound output device.

A sensor output device according to the first aspect of the present invention includes: a sensor that includes a piezoelectric element and an output terminal, the piezoelectric element including porous resin; and an output circuit that includes a thermistor, the thermistor connecting the output terminal of the sensor to ground.

A sensor output device according to a second aspect of the present invention includes: a sensor that includes a piezoelectric element that includes porous resin; and an output circuit that is connected with the sensor, the output circuit including an operational amplifier and a feedback circuit, the feedback circuit including a thermistor connected with the operational amplifier.

According to an embodiment of the present invention, it is possible to provide a sensor output device that includes a sensor including a piezoelectric element containing porous resin and that is capable of temperature compensation for suppressing fluctuation in the output level due to temperature change, and a musical instrument that includes the sensor output device.

DETAILED DESCRIPTION OF THE INVENTION

First Embodiment

A sensor output device 100 according to a first embodiment of the present invention will be described in detail hereinbelow, referring to FIG. 1 to FIG. 6. In order to make the drawings easy to comprehend, the thickness and dimension ratio of each constitutional element have been suitably adjusted.

Figure 1:
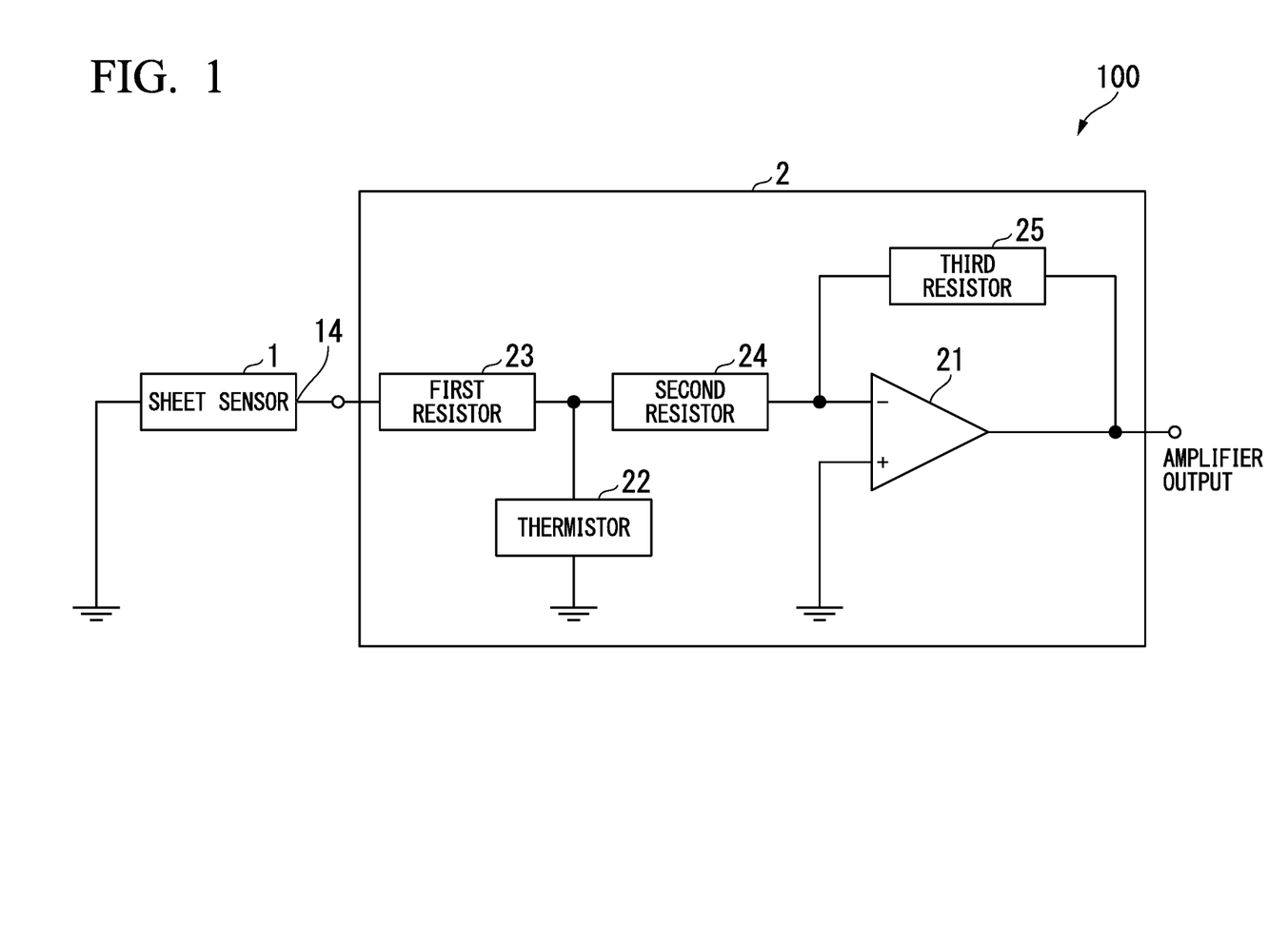
FIG. 1 is a block diagram that shows a sensor output device according to a first embodiment of the present invention.

FIG. 1 is a block diagram showing the sensor output device 100. As shown in FIG. 1, the sensor output device 100 includes a sheet sensor 1 and a sensor output circuit 2. The sheet sensor 1 and the sensor output circuit (output circuit) 2 are housed in one case (that is, in the same case).

Figure 10:
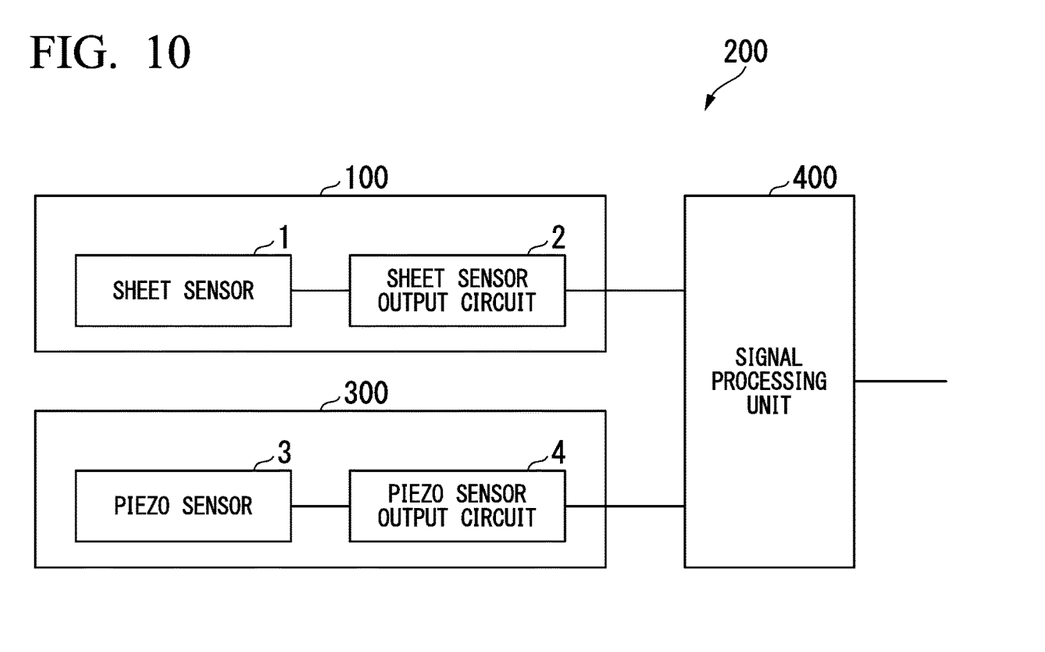
FIG. 10 is a block diagram of a sound output device for an acoustic guitar according to a third embodiment of the present invention.

Here, FIG. 10 shows that the sheet sensor 1 and the sensor output circuit 2 are housed in the case of the sensor output device 100.

Figure 2:
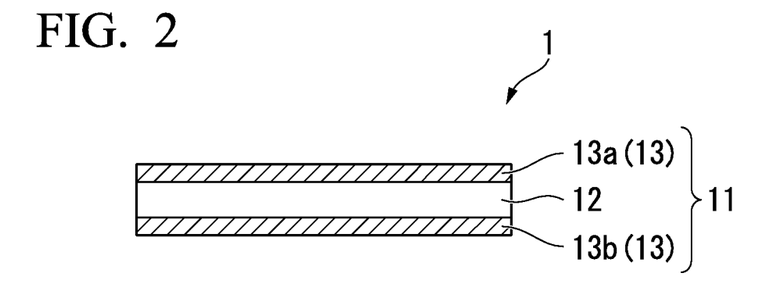
FIG. 2 is a side view of the sensor of the sensor output device shown in FIG. 1.

FIG. 2 is a side view of the sheet sensor 1 shown in FIG. 1. The sheet sensor (sensor) 1 is a sensor that includes a sheet-shaped piezoelectric element 11 containing porous resin. The piezoelectric element 11 includes electrode layers 13 (a first electrode layer 13a and a second electrode layer 13b) laminated on both sides of an electretized film 12 as shown in FIG. 2.

The electretized film 12 is a sheet-like film containing porous resin. For example, the electretized film 12 is obtained by the following manner. First, a resin film consisting of an electrolyte layer provided on at least one surface of a porous layer is permeated with a non-reactive gas under a high-pressure condition. Subsequently the resin film is thermally treated under reduced pressure to obtain a porous resin film. The porous resin film is then electretized by a direct-current high-voltage discharge treatment, and thereby the electretized film 12 is obtained (for example, see Japanese Unexamined Patent Application, First Publication No. 2010-89495).

The electretized film 12 is obtained by electretizing the porous resin film containing a porous layer capable of holding electric charges therein, and can stably hold electric charges for a long period of time.

The electretized film 12 is known to exhibit a piezoelectric effect and so can be used for vibration measurement, vibration control, sound generation, sound detection, and the like. Therefore, by making use of the light weight, the electretized film 12 can be used for transducers in audio equipment such as speakers, headphones, microphones and the like and for flexible sheet-shaped pressure sensors.

As shown in FIG. 2, the electrode layer 13 is laminated on both surfaces of the electretized film 12. The electrode layer 13 includes the first electrode layer 13a and the second electrode layer 13b. The first electrode layer 13a and the second electrode layer 13b are connected to respective lead wires (not shown in the figure), with one of the lead wires connected to an output terminal 14 and the other to ground. The material for forming the first electrode layer 13a and the second electrode layer 13b is not particularly limited as long as the material is electrically conductive, and examples thereof include various types of metals such as aluminum and silver, alloys of these metals, carbon and the like.

The sheet sensor 1 that includes such a piezoelectric element 11 containing porous resin is suited for detection of sound due to being flexible in the thickness direction, and also does not inhibit vibration of a musical instrument owing to the lightweight properties and thinness thereof. Therefore, the sheet sensor 1 is suitably used as a musical instrument pickup that detects both vibration and sound. It is to be noted that the term "sound" as referred to means a compressional wave transmitted through air, and the term "vibration" as referred to means vibration that propagates in a solid to a sensor.

Figure 3:
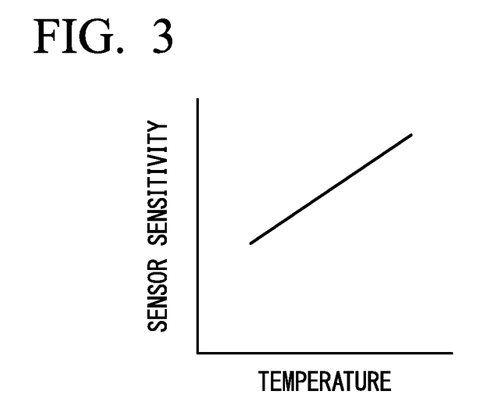
FIG. 3 is a graph showing the relationship between temperature of the sensor of the sensor output device shown in FIG. 1 and the sensor sensitivity.

FIG. 3 is a graph that shows the relationship between the temperature of the sheet sensor 1 and the sensor sensitivity. As shown in FIG. 3, the sensor sensitivity of the sheet sensor 1 increases as the temperature rises owing to the characteristics of the material, and so the voltage level of the output signal from the sheet sensor 1 increases. The temperature dependence is about +0.2 db/° C. The sheet sensor 1 has a linear temperature dependence in a range from 0° C. to 50° C., which is the use temperature range when the sensor output device 100 is used as a pickup for a musical instrument.

As shown in FIG. 1, the sensor output circuit 2 includes an operational amplifier 21, a thermistor 22, a first resistor 23, a second resistor 24, and a third resistor 25. The first resistor 23, the second resistor 24, and the third resistor 25 are resistors. In the block diagram shown in FIG. 1, only major electronic components are shown, while those components such as capacitors and resistors, even though required for electronic circuits, are omitted due to not being directly related to the effect of the present embodiment.

The thermistor 22 is a resistor that shows a large resistance change with respect to temperature change. The thermistor 22 is a general thermally sensitive resistor. The type of the thermistor 22 is not particularly limited. The thermistor 22 may be one having a negative temperature coefficient, for example, an NTC-type thermistor.

Figure 4:
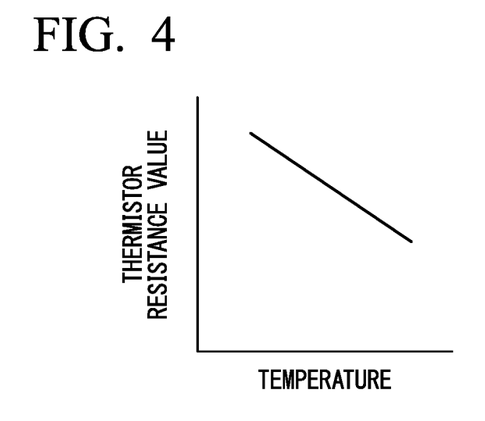
FIG. 4 is a graph showing the relationship between the temperature and resistance value of the thermistor in the sensor output circuit of the sensor output device shown in FIG. 1.

FIG. 4 is a graph showing the relationship between the temperature and the resistance value Rs of the thermistor 22. As shown in FIG. 4, the thermistor 22 has a resistance temperature characteristic in which the resistance value Rs decreases as the temperature increases. The thermistor 22 has a linear resistance temperature characteristic in a range of 0° C. to 50° C., which is the use temperature range when the sensor output device 100 is used as a musical instrument pickup.

The thermistor 22 and the first resistor 23 form a voltage dividing circuit for dividing the voltage of the electrical signal input from the output terminal 14 of the sheet sensor 1. The output voltage $V_{out}$ of the voltage dividing circuit is determined by the ratio of the resistance value R1 of the first resistor 23 and the resistance value Rs of the thermistor 22. Assuming that the input voltage from the output terminal 14 of the sheet sensor 1 is $V_{in}$, the output voltage $V_{out}$ of the voltage dividing circuit is $(R1/R1+Rs) \times V_{in}$. Even in the absence of the first resistor 23, if the thermistor 22 is disposed so as to connect the output terminal 14 of the sheet sensor 1 to ground, the above-mentioned voltage dividing circuit functions.

Figure 5:
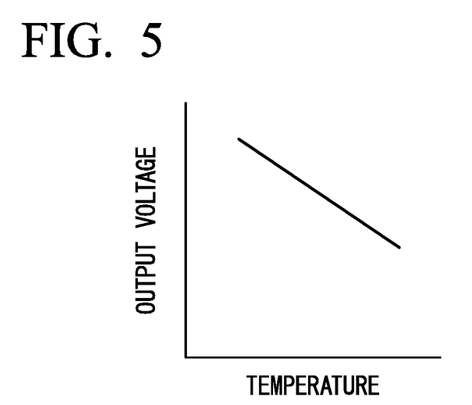
FIG. 5 is a graph showing the relationship between the temperature of the thermistor and the output voltage of the voltage dividing circuit in the sensor output circuit of the sensor output device shown in FIG. 1.

FIG. 5 is a graph showing the relationship between the temperature of the thermistor 22 and the output voltage of the voltage dividing circuit. As shown in FIG. 4, as the temperature of the thermistor 22 rises, the resistance value Rs decreases. Therefore, in the case of a constant input voltage, when the temperature rises, the output voltage of the voltage dividing circuit decreases.

The operational amplifier 21 amplifies the electrical signal input from the output terminal 14 of the sheet sensor 1. The electrical signal output from the output terminal 14 is connected to the inverting input terminal (−) of the operational amplifier 21 via the voltage dividing circuit formed by the thermistor 22 and the first resistor 23, and via the second resistor 24. The non-inverting input terminal (+) of the operational amplifier 21 is connected to ground. The output signal of the operational amplifier 21 is connected to the inverting input terminal (−) of the operational amplifier 21 via a feedback resistor constituted by the third resistor 25.

The sensor output circuit 2 thus configured constitutes a so-called inverting amplifier circuit, whereby the input signal is amplified and inverted at the output. Here, the sensor output circuit 2 is not limited to an inverting amplifier circuit. The sensor output circuit 2 may alternatively have feedback provided by a feedback circuit and be a circuit that simply amplifies the input signal, such as a non-inverting amplifier circuit.

The type of the operational amplifier 21 is not particularly limited. In order to amplify the input signal from the sheet sensor 1, the operational amplifier 21 is selected so that the range of the input voltage from the sheet sensor 1 is included in the linear region and not included in the saturation region of the operational amplifier 21.

Next, the operation when the temperature of the sensor output device 100 changes will be described. When the temperature rises, the level of the output signal from the sheet sensor 1 rises as shown in FIG. 3. As a result, the voltage level of the input signal input to the voltage dividing circuit rises. On the other hand, when the temperature rises, the output voltage output from the voltage dividing circuit decreases as shown in FIG. 5 under the condition where the input voltage is held constant.

Figure 6:
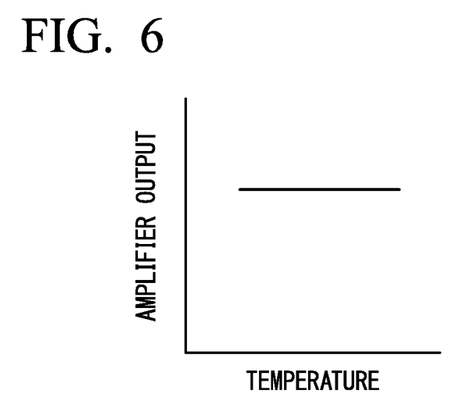
FIG. 6 is a graph showing the relationship between the temperature of the sensor output device and the voltage level of the output signal.

FIG. 6 is a graph showing the relationship between the temperature of the sensor output device 100 and the voltage level of the output signal. As shown in FIG. 6, even when the temperature of the sensor output device 100 rises, leading to an increase in the voltage level of the input signal to the sensor output circuit 2, it is possible to suppress fluctuation of the input voltage to the operational amplifier 21 and to suppress fluctuation of the voltage level of the sensor output circuit 2 due to the drop of the output voltage by the voltage dividing circuit.

(Effect of First Embodiment)

According to the sensor output device 100 of the present embodiment configured as described above, the sensor output circuit 2 enables temperature compensation for suppressing fluctuation in the output level due to temperature change of the sheet sensor 1 which includes the sheet-like piezoelectric element 11 containing porous resin.

Further, according to the sensor output device 100 of the present embodiment, the sensor output circuit 2 can be easily realized simply by adding a simple electrical circuit, and so can be realized at low cost.

The direction of change in characteristics due to temperature is opposite between the temperature characteristic of the sensor sensitivity of the sheet sensor 1 (see FIG. 3) and the temperature characteristic of the voltage dividing circuit formed by the thermistor 22 (see FIG. 5). In particular, in the range of 0° C. to 50° C., which is the use temperature range when the sensor output device 100 is used as a pickup for a musical instrument, the temperature characteristic of the sensor sensitivity of the sheet sensor 1 (see FIG. 3) and the temperature characteristic of the voltage dividing circuit formed by the voltage dividing circuit (see FIG. 5) each have a linear temperature characteristic. Therefore, particularly in this operating temperature range, the sensor output circuit 2 even with a simple configuration suitably performs temperature compensation for suppressing fluctuation of the output level due to temperature change of the sheet sensor 1.

Further, according to the sensor output device 100 of the present embodiment, the sheet sensor 1 and the sensor output circuit 2 are housed in one case, and so the ambient temperature of the sheet sensor 1 and the ambient temperature of the sensor output circuit 2 are equivalent. Therefore, in the aforementioned temperature compensation, it is not necessary to consider the case of the ambient temperatures of the two being different, which simplifies the temperature compensation.

While the first embodiment of the invention has been described in detail heretofore with reference to the drawings, it should be understood that the specific constitutions are not limited to this embodiment and any design changes which do not depart from the scope of the present invention are included in the present invention. Constitutions are also possible in which the constituent elements shown in the aforementioned first embodiment and the modifications described below are suitably combined.

(Modification 1)

For example, in the above-described embodiment, the piezoelectric element 11 is formed by laminating the electrode layers 13 on the electretized film 12, and the electretized film 12 is formed by causing a resin film including an electrolyte layer provided on at least one surface of a porous layer to be permeated with a non-reactive gas under high-pressure conditions and subsequently thermally treated under reduced pressure to obtain a porous resin film, which is then electretized upon being subjected to a direct-current high-voltage discharge treatment. However, the type of the piezoelectric element is not limited thereto. The piezoelectric element may be a porous resin film including a porous layer capable of holding charges and thereby exhibiting a piezoelectric effect. Further, the shape of the piezoelectric element is not limited to a sheet-like shape, and may, for example, have a block shape.

Second Embodiment

Hereinbelow, a sensor output device 100B according to a second embodiment of the present invention will be described with reference to FIGS. 7 to 9. In order to make the drawings easy to comprehend, the thickness and dimension ratio of each constitutional element have been suitably adjusted. The same reference numerals will be used to refer to components identical to those already described, with redundant descriptions being omitted.

Figure 7:
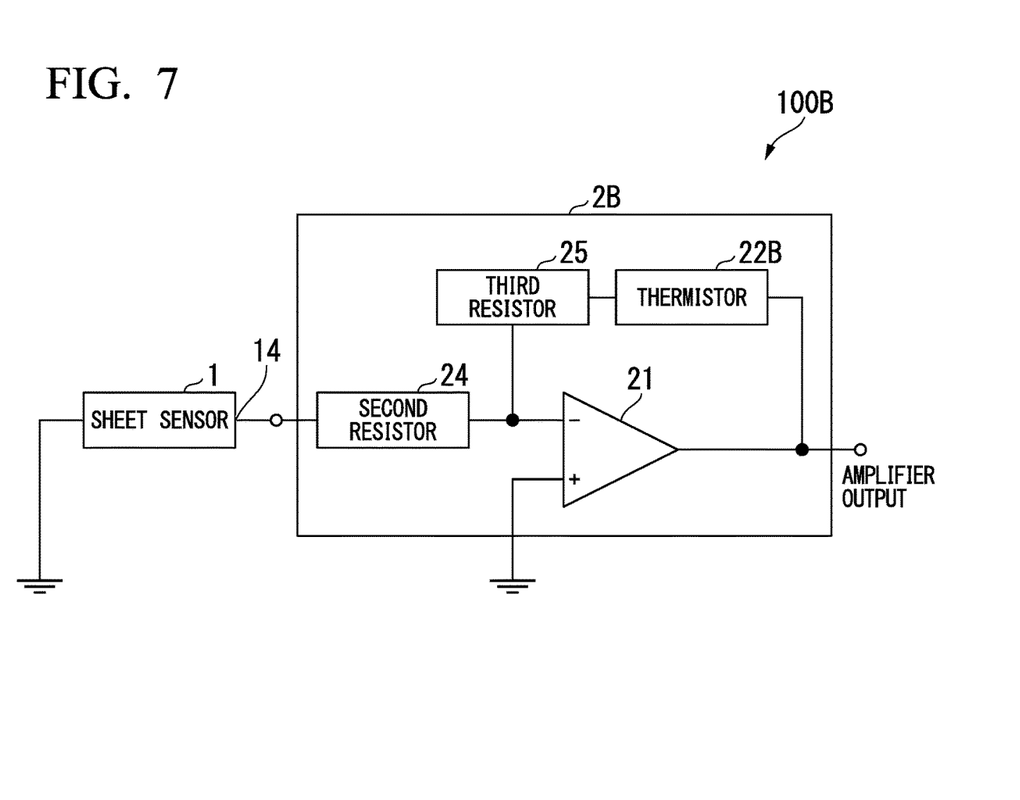
FIG. 7 is a block diagram showing a sensor output device according to a second embodiment of the present invention.

FIG. 7 is a block diagram showing the sensor output device 100B. As shown in FIG. 7, the sensor output device 100B includes a sheet sensor 1 and a sensor output circuit (output circuit) 2B. The sheet sensor 1 and the sensor output circuit 2B are housed in one case.

As shown in FIG. 7, the sensor output circuit 2B includes an operational amplifier 21, a thermistor 22B, a second resistor 24, and a third resistor 25. The second resistor 24 and the third resistor 25 are resistors. In the block diagram shown in FIG. 7, only major electronic components are shown, while those components such as capacitors and resistors, even though required for electronic circuits, are omitted due to not being directly related to the effect of the present embodiment.

The operational amplifier 21 amplifies the electrical signal input from an output terminal 14 of the sheet sensor 1. The electrical signal output from the output terminal 14 is connected to the inverting input terminal (−) of the operational amplifier 21 via the second resistor 24. The non-inverting input terminal (+) of the operational amplifier 21 is connected to ground. The output signal of the operational amplifier 21 is connected to the inverting input terminal (−) of the operational amplifier 21 via a feedback circuit constituted by the thermistor 22B and the third resistor 25.

The sensor output circuit 2B thus configured constitutes a so-called inverting amplifier circuit, whereby the input signal is amplified and inverted at the output. Here, the sensor output circuit 2B is not limited to an inverting amplifier circuit. The sensor output circuit 2B may alternatively have feedback provided by a feedback circuit and be a circuit that simply amplifies the input signal, such as a non-inverting amplifier circuit.

The type of operational amplifier 21 is not particularly limited. In order to amplify the input signal from the sheet sensor 1, the operational amplifier 21 is selected so that the range of the input voltage from the sheet sensor 1 is included in the linear region and not the saturation region of the operational amplifier 21.

Similarly to the thermistor 22, the thermistor 22B is a resistor that shows a large resistance change with respect to temperature change. The thermistor 22B is a general thermally sensitive resistor. The type of the thermistor 22B is not particularly limited. The thermistor 22B may be one having a negative temperature coefficient, for example, an NTC-type thermistor.

The thermistor 22B and the third resistor 25 constitute a feedback circuit of the operational amplifier 21. Since the thermistor 22B and the third resistor 25 are connected in series, the resistance value Rf of the feedback circuit is a value obtained by adding the resistance value Rs of the thermistor 22 and the resistance value R2 of the third resistor 25.

Figure 8:
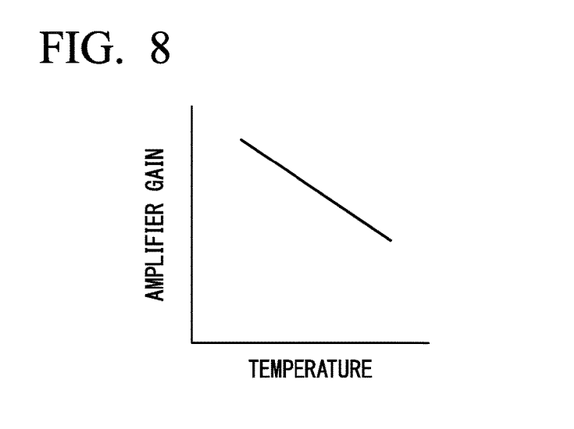
FIG. 8 is a graph showing the relationship between the temperature and amplifier gain of the sensor output circuit of the sensor output device shown in FIG. 7.

FIG. 8 is a graph showing the relationship between the temperature of the sensor output circuit 2B and the amplifier gain when the input signal level is constant. The sensor output circuit 2B is an inverting amplifier circuit. The amplification factor of the output signal of the sensor output circuit 2B is determined by the ratio (Rf/R2) of the resistance value Rf of the feedback circuit to the resistance value R2 of the second resistor 24. When the temperature rises, as shown in FIG. 4, the resistance value Rs of the thermistor 22B decreases and so the resistance value Rf of the feedback circuit also decreases. For that reason, as shown in FIG. 8, the amplifier gain of the sensor output circuit 2B also decreases.

Note that the configuration of the feedback circuit is not limited to the configuration of the thermistor 22B and the third resistor 25 connected in series. Any configuration of the feedback circuit is possible as long as the resistance value thereof decreases as the temperature rises. For example, the thermistor 22B and the third resistor 25 may be connected in parallel.

Next, the operation when the temperature of the sensor output device 100B changes will be described. When the temperature rises, the level of the output signal from the sheet sensor 1 rises as shown in FIG. 3. As a result, the voltage level of the input signal inputted to the sensor output circuit 2B rises. On the other hand, when the temperature rises, the amplifier gain of the sensor output circuit 2B decreases as shown in FIG. 8.

Figure 9:
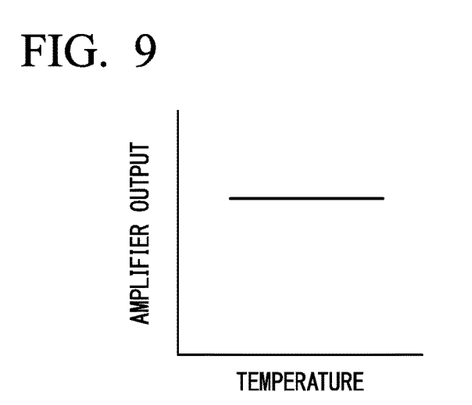
FIG. 9 is a graph showing the relationship between the temperature of the sensor output device shown in FIG. 7 and the voltage level of the output signal.

FIG. 9 is a graph showing the relationship between the temperature of the sensor output device 100B and the voltage level of the output signal. Even when the temperature of the sensor output device 100B rises and the voltage level of the input signal to the sensor output circuit 2B rises, as shown in FIG. 9, it is possible to suppress fluctuation of the voltage level of the sensor output circuit 2B due to the drop in the amplifier gain of the sensor output circuit 2B.

(Effect of Second Embodiment)

According to the sensor output device 100B of the present embodiment configured as described above, the sensor output circuit 2B enables temperature compensation for suppressing fluctuation in the output level due to temperature change of the sheet sensor 1 that includes the sheet-like piezoelectric element 11 containing porous resin.

Further, according to the sensor output device 100B of the present embodiment, the sensor output circuit 2 can be easily realized simply by adding a simple electrical circuit, and so can be realized at low cost.

The direction of change in characteristics due to temperature is opposite between the temperature characteristic of the sensor sensitivity of the sheet sensor 1 (see FIG. 3) and the temperature characteristic of the amplifier gain of the sensor output circuit 2B (see FIG. 8). In particular, in the range of 0° C. to 50° C., which is the use temperature range when the sensor output device 100B is used as a pickup for a musical instrument, the temperature characteristic of the sensor sensitivity of the sheet sensor 1 (see FIG. 3) and the temperature characteristic of the amplifier gain of the sensor output circuit 2B (see FIG. 8) have a linear temperature characteristic. Therefore, particularly in this operating temperature range, the sensor output circuit 2B even with a simple configuration suitably performs temperature compensation for suppressing fluctuation of the output level due to temperature change of the sheet sensor 1.

Further, according to the sensor output device 100B of the present embodiment, the sheet sensor 1 and the sensor output circuit 2B are stored in one case, and so the ambient temperature of the sheet sensor 1 and the ambient temperature of the sensor output circuit 2B are equal to each other. Therefore, in the aforementioned temperature compensation, it is not necessary to consider the case of the ambient temperatures of the two being different, which simplifies the temperature compensation.

Third Embodiment

Figure 11:
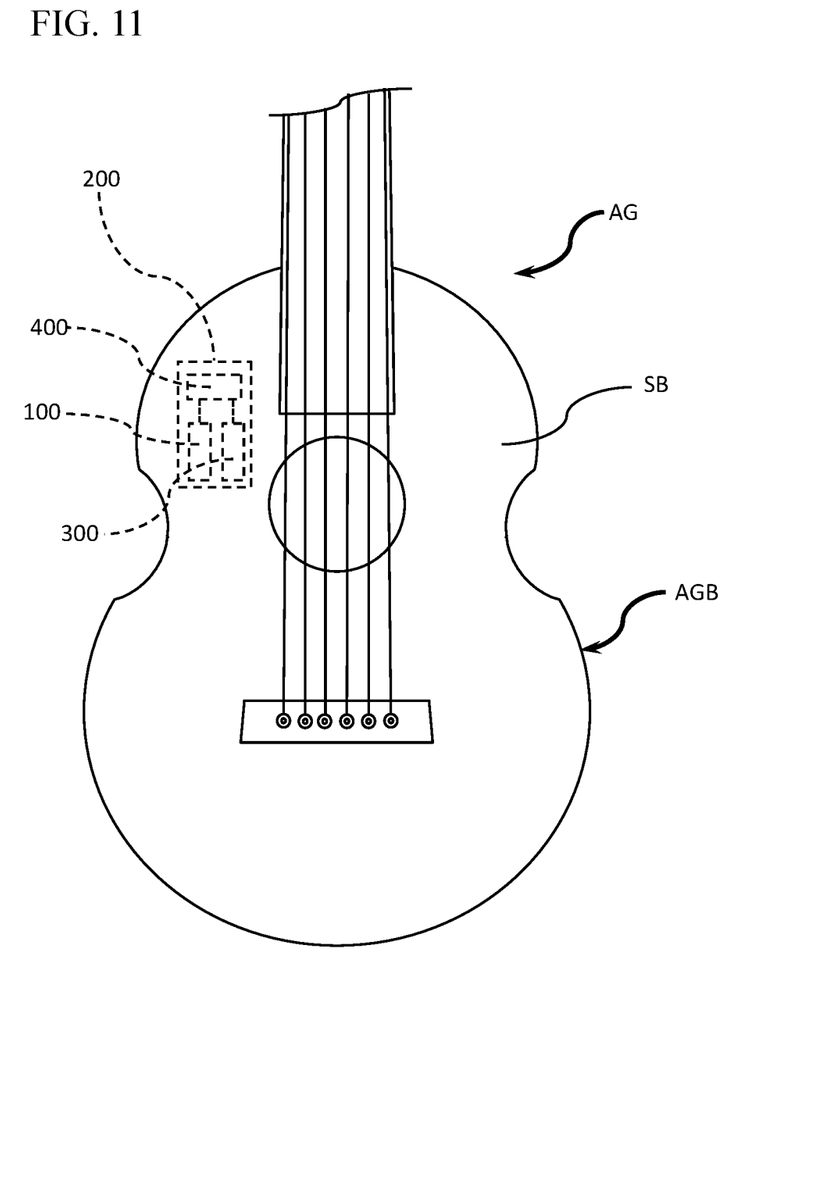
FIG. 11 is a schematic view of the acoustic guitar representing a musical instrument including a musical instrument body with the sound output device mounted thereto.

A third embodiment of the present invention will be described with reference to FIGS. 10-11. A sound output device 200 for an acoustic guitar AG, representing a musical instrument, according to the third embodiment of the present invention includes at least the sensor output device 100. In the following description, the same reference numerals will be used to refer to components identical to those already described, with redundant descriptions being omitted.

FIG. 10 is a block diagram of a sound output device 200 for the acoustic guitar AG. As shown in FIG. 10, the sound output device 200 includes the sensor output device 100, a piezo sensor output device 300, and a signal processing unit 400.

The sheet sensor 1 is attached to a part functioning as the soundboard SB of the body AGB of the acoustic guitar AG and is used as an acoustic guitar pickup for detecting vibration.

The piezo sensor output device (second sensor output device) 300 includes a piezo sensor 3 and a piezo sensor output circuit 4.

The piezo sensor (second sensor) 3 is a sensor that includes a piezo element for converting vibration into an electrical signal. The piezo sensor 3 can convert physical vibration of the soundboard or the like directly into a sound signal by means of a piezo element in which an electric current is generated by application of pressure.

Like the sheet sensor 1, the piezo sensor 3 is also attached to a part functioning as the soundboard in the acoustic guitar body and is used as an acoustic guitar pickup for detecting vibration.

The piezo sensor output circuit (second sensor output circuit) 4 is an output circuit having, for example, an operational amplifier for amplifying the weak output signal of the piezo sensor 3. The piezo sensor 3 has a lower temperature dependence than the sheet sensor 1, so no particular temperature compensation is necessary for the piezo sensor output circuit 4.

The signal processing unit 400 receives the output of the sensor output device 100 and the output of the piezo sensor output device 300, converts the output signals from the two sensors into sound signals by signal processing, adjusts (mixes) the levels of the sound signals, and then outputs the final sound signal. The signal processing unit 400 can also add sound effects to the acoustic signal if necessary.

The signal processing unit 400 may be constituted with a computer including a CPU and memory and be capable of executing a program, and a part or all of the signal processing unit 400 may be constituted with dedicated hardware such as a digital signal processor.

Next, the operation of the sound output device 200 for an acoustic guitar will be described. When a performer plays the acoustic guitar, the sheet sensor 1 and the piezo sensor 3 attached to the soundboard of the body of the acoustic guitar detect the vibration of the soundboard of the body of the acoustic guitar. The sensor output circuit 2 and the piezo sensor output circuit 4 output the output signals of the respective sensors to the signal processing unit 400. The signal processing unit 400 adjusts the levels of the sound signals and outputs the final sound signal.

When the ambient temperature of the acoustic guitar and the sound output device 200 rises due to the acoustic guitar sound output device 200 being illuminated by stage lighting or the like, temperature compensation is required for the output signal from the sheet sensor 1. This is because the sensor sensitivity of the sheet sensor 1 increases as the temperature rises as shown in FIG. 3, and the voltage level of the output signal from the sheet sensor 1 rises. On the other hand, the temperature dependence of the piezo sensor 3 is low compared to the sheet sensor 1, and so in such a situation temperature compensation is not necessary for the output signal from the piezo sensor 3.

Originally, when the output of the sensor output device 100 and the output of the piezo sensor output device 300 are input to the signal processing unit 400 without temperature compensation, the signal processing unit 400 needs to adjust the level of each sound signals in consideration of the temperature dependence of each sensor. However, due to the temperature compensation function of the sensor output circuit 2, fluctuation of the output level due to temperature change of the sheet sensor 1 can be favorably suppressed. Therefore, the signal processing unit 400 can adjust the level of the sound signal acquired from each sensor without considering temperature dependence.

(Effect of Third Embodiment)

According to the sound output device 200 of the present embodiment configured as described above, temperature compensation is performed for the output circuit of the sensor in which temperature compensation is required (for example, sheet sensor 1). Therefore, even when a plurality of sensors (sheet sensor 1 and piezo sensor 3) have different temperature characteristics, it is not necessary to consider temperature compensation when adjusting the levels of the sound signals.

According to the sound output device 200 of the present embodiment, in the range of 0° C. to 50° C., which is the use temperature range when the sensor output device 100 is used as an acoustic guitar pickup, similarly to the first embodiment, temperature compensation for suppressing fluctuation of the output level due to the temperature change of the sheet sensor 1 can be suitably performed with an inexpensive and simple electrical circuit.

While a third embodiment of the invention has been described in detail heretofore with reference to the drawings, it should be understood that the specific constitutions are not limited to this embodiment and any design changes not departing from the scope of the present invention are included in the present invention. Constitutions are also possible in which the constituent elements shown in the aforementioned third embodiment and the modifications described below are suitably combined.

(Modification 2)

For example, in the above-described embodiment, the sound output device 200 is attached to an acoustic guitar and used as a pickup, but the musical instrument to which the sound output device 200 is mounted is not limited to an acoustic guitar. The sound output device 200 can be attached to a musical instrument that converts vibration to sound, such as a marimba or the like.

(Modification 3)

In the above embodiment, the second sensor used together with the sheet sensor is the piezo sensor 3, but the type of the second sensor is not limited thereto. The second sensor may be a sensor that can be used as a pickup for a musical instrument.

(Modification 4)

In the above embodiment, temperature compensation is performed by providing the thermistor 22 in the sensor output circuit 2, but the method of temperature compensation is not limited thereto. An element or a sensor capable of detecting a temperature change such as a thermistor or the like may be provided in a case with the sheet sensor, and a signal processing device, upon detecting a temperature change, may apply signal processing corresponding to the temperature compensation of the sheet sensor. In addition, if such processing is enabled as an auxiliary function of the sound output device of the above embodiment, temperature compensation of the sheet sensor can be more reliably performed.

(Modification 5)

In the above embodiment, the acoustic guitar (musical instrument) includes the sheet sensor 1 and the piezo sensor 3, but the type of the sensors mounted on the acoustic guitar (musical instrument) is not limited thereto. The acoustic guitar (musical instrument) may include only the sheet sensor 1, or may include another sensor besides the sheet sensor 1 and the piezo sensor 3.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. In addition, the constituent elements shown in the embodiments and the modifications described below can be combined appropriately. Accordingly, the invention is not to be considered as being limited by the foregoing description, and is only limited by the scope of the appended claims.

What is claimed is:

1. A sensor output device comprising:
   a sensor comprising an output terminal and a piezoelectric element that comprises an electretized film containing porous resin, a sensitivity of the sensor exhibiting a linear temperature dependence within a predetermined temperature range; and
   an output circuit connected to the output terminal of the sensor and comprising:
   a first resistor connected to the output terminal of the sensor;
   a thermistor connected to the first resistor and to ground; and
   a second resistor connected to the first resistor and to the thermistor.

2. The sensor output device according to claim 1, wherein the output circuit further comprises a third resistor connected in series to the second resistor.

3. The sensor output device according to claim 1, wherein the sensor and the output circuit are housed in a single case.

4. The sensor output device according to claim 1, wherein a resistance value of the thermistor decreases as temperature of the thermistor rises in the predetermined temperature range.

5. The sensor output device according to claim 1, wherein the predetermined temperature range is 0° C. to 50° C.

6. The sensor output device according to claim 1, wherein each of the first and second resistors is a fixed resistor.

7. The sensor output device according to claim 1, wherein output circuit further comprises an operational amplifier including an inverting input terminal connected to the second resistor.

8. A sensor output device comprising:
a sensor comprising an output terminal and a piezoelectric element that comprises an electretized film containing porous resin, a sensitivity of the sensor exhibiting a linear temperature dependence within a predetermined temperature range; and
an output circuit connected to the output terminal of the sensor, and comprising:
a thermistor;
an operational amplifier; and
a feedback circuit comprising the thermistor connected to the operational amplifier.

9. The sensor output device according to claim 8, wherein:
the operational amplifier comprises an inverting input terminal and an output terminal, and
the feedback circuit is connected to the inverting input terminal of the operational amplifier and the output terminal of the operational amplifier.

10. The sensor output device according to claim 8, wherein the feedback circuit further comprises a resistor connected in series with the thermistor.

11. A musical instrument comprising:
a musical instrument body; and
a first sensor output device comprising:
a first sensor comprising an output terminal and a piezoelectric element that comprises an electretized film that comprises porous resin, a sensitivity of the first sensor exhibiting a linear temperature dependence within a predetermined temperature range; and
a first output circuit connected to the output terminal of the first sensor and comprising:
a first resistor connected to the output terminal of the first sensor;
a thermistor connected to the first resistor and to ground; and
a second resistor connected to the first resistor and to the thermistor.

12. The musical instrument according to claim 11, further comprising a second sound output device comprising:
a second sensor; and
a second output circuit connected to the second sensor.

13. The musical instrument according to claim 12, further comprising a signal processing unit that processes an output signal of the first sensor output device and an output signal of the second sensor output device.

14. The musical instrument according to claim 11, wherein the predetermined temperature range is 0° C. to 50° C.

* * * * *